United States Patent
Fan et al.

(10) Patent No.: US 12,317,427 B2
(45) Date of Patent: May 27, 2025

(54) UV CURABLE DIELECTRIC MATERIALS FOR 3D PRINTING AND 3D PRINTING SYSTEMS WITH THE SAME

(71) Applicant: Toyota Motor Engineering & Manufacturing North America, Inc., Plano, TX (US)

(72) Inventors: Tianzhu Fan, Houston, TX (US); Feng Zhou, Ann Arbor, MI (US); Ercan Mehmet Dede, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 184 days.

(21) Appl. No.: 18/162,003

(22) Filed: Jan. 31, 2023

(65) Prior Publication Data

US 2024/0260201 A1   Aug. 1, 2024

(51) Int. Cl.
  *B29C 64/112*  (2017.01)
  *B29C 64/209*  (2017.01)
  (Continued)

(52) U.S. Cl.
  CPC ......... *H05K 3/4664* (2013.01); *B29C 64/209* (2017.08); *B29C 64/314* (2017.08);
  (Continued)

(58) Field of Classification Search
  CPC ............ B29C 35/02; B29C 2035/0827; B29C 64/106; B29C 64/112; B29C 64/209; B29C 64/245; B29C 64/264; B29C 64/295; B29C 64/336; B29C 64/343; B29C 64/386; B29C 64/393; B29C 71/02; B29C 71/04; B33Y 10/00; B33Y 30/00; B33Y 40/20;
  (Continued)

(56) References Cited

U.S. PATENT DOCUMENTS

| 4,961,998 A | 10/1990 | Senkalski et al. |
| 2014/0079841 A1* | 3/2014 | Pridoehl ............... B29C 64/209 425/375 |

(Continued)

OTHER PUBLICATIONS

Rao et al., "Polymer nanocomposites with a low thermal expansion coefficient," Macromolecules, vol. 31, issue 3, 2008, pp. 935-941.

(Continued)

*Primary Examiner* — Leo B Tentoni
(74) *Attorney, Agent, or Firm* — Christopher G. Darrow; Darrow Mustafa PC

(57) ABSTRACT

A 3D printing system includes a reservoir for a UV-curable dielectric material in communication with a first nozzle configured to print the UV-curable dielectric material onto a substrate and a reservoir for a low CTE filler in communication with a second nozzle configured to print the low CTE filler onto the substrate, and a reservoir for a conductive ink in communication with a third nozzle configured to print the conductive ink onto the substrate. The 3D printing system prints the UV-curable dielectric material and the low CTE filler such that the printed low CTE filler mixes with the printed UV-curable dielectric material and forms a UV-curable dielectric layer with the low CTE filler dispersed therein.

20 Claims, 4 Drawing Sheets

(51) Int. Cl.

| | | |
|---|---|---|
| *B29C 64/314* | (2017.01) | |
| *B29C 71/02* | (2006.01) | |
| *B29C 71/04* | (2006.01) | |
| *B33Y 10/00* | (2015.01) | |
| *B33Y 30/00* | (2015.01) | |
| *B33Y 40/20* | (2020.01) | |
| *B33Y 70/10* | (2020.01) | |
| *B33Y 80/00* | (2015.01) | |
| *H05K 3/12* | (2006.01) | |
| *H05K 3/46* | (2006.01) | |
| *B29K 33/04* | (2006.01) | |
| *B29K 105/00* | (2006.01) | |
| *B29K 105/16* | (2006.01) | |
| *B29K 505/14* | (2006.01) | |
| *B29K 507/04* | (2006.01) | |
| *B29K 509/02* | (2006.01) | |
| *B29L 31/34* | (2006.01) | |
| *B41J 2/175* | (2006.01) | |
| *B41J 3/407* | (2006.01) | |
| *B41M 1/26* | (2006.01) | |

(52) U.S. Cl.
CPC ............... *B33Y 10/00* (2014.12); *B33Y 30/00* (2014.12); *B33Y 70/10* (2020.01); *B33Y 80/00* (2014.12); *H05K 3/1241* (2013.01); *H05K 3/125* (2013.01); *H05K 3/4673* (2013.01); *B29K 2033/04* (2013.01); *B29K 2105/0002* (2013.01); *B29K 2105/162* (2013.01); *B29K 2505/14* (2013.01); *B29K 2507/04* (2013.01); *B29K 2509/02* (2013.01); *B29K 2995/0005* (2013.01); *B29K 2995/0006* (2013.01); *B29K 2995/0012* (2013.01); *B29L 2031/3425* (2013.01); *B41J 2/17596* (2013.01)

(58) Field of Classification Search
CPC ...... B33Y 50/00; B33Y 50/02; B41J 2/17596; B41J 3/407; B41M 1/26; H05K 3/1241; H05K 3/125; H05K 3/4664

USPC ........ 264/104, 236, 308, 494; 425/135, 145, 425/174.4, 375, 470; 347/6, 9, 47, 85, 347/95, 100; 29/846

See application file for complete search history.

(56) References Cited

U.S. PATENT DOCUMENTS

| | | | |
|---|---|---|---|
| 2019/0373738 A1* | 12/2019 | Kozlovski | .............. H05K 3/125 |
| 2020/0326639 A1 | 10/2020 | Shores et al. | |
| 2022/0064466 A1 | 3/2022 | Pujari et al. | |
| 2022/0203606 A1* | 6/2022 | Belitzky | ............... B29C 64/393 |

OTHER PUBLICATIONS

Suzuki et al., "Fabrication of mesoporous silica KIT-6/polymer composite and its low thermal expansion property," Materials letters, vol. 65, issue 3, Feb. 2011, pp. 544-547.

Lee et al., "Thermal expansion behavior of composites based on axisymmetric ellipsoidal particles," Polymer, 2007, 48 (14), pp. 4174-4183.

Chen et al., "3D printing of ceramics: A review," Journal of the European Ceramic Society, vol. 39, issue 4, Apr. 2019, pp. 661-687.

Guan et al., "Lightweight, tough, and sustainable cellulose nanofiber-derived bulk structural materials with low thermal expansion coefficient," Science advances, vol. 6, issue 18, May 1, 2020, pp. 1-9.

Han et al., "Effect of filler structure on the dielectric and thermal properties of SiO2/PTFE composites," Journal of Materials Science: Materials in Electronics, vol. 31, 2020, pp. 9196-9202.

Unknown, "Fortify and Rogers Corporation to develop 3D printable dielectric materials," May 25, 2021, 4 pages, found at https://www.3dprintingmedia.network/fortify-and-rogers-corporation-to-develop-3d-printable-dielectric-materials/.

* cited by examiner

UV CURABLE DIELECTRIC MATERIALS FOR 3D PRINTING AND 3D PRINTING SYSTEMS WITH THE SAME

TECHNICAL FIELD

The present disclosure relates to 3D printing, and particularly to 3D printing of UV curable dielectric materials.

BACKGROUND

Printed circuit boards (PCBs) typically include conductive pathways of copper sheets laminated onto a non-conductive substrate and thereby provide mechanical support and electrical connection of electronic components. And multi-layer PCBs provide higher capacity and/or density of electronic components in a smaller footprint by incorporating two or more layers. However, the design and/or manufacture of multilayer PCBs can be cost and time intensive.

The present disclosure addresses issues related to the manufacture of multi-layer PCBs and other issues related to multi-layer PCBs.

SUMMARY

This section provides a general summary of the disclosure and is not a comprehensive disclosure of its full scope or all of its features.

In one form of the present disclosure, a 3D printing system includes a reservoir for a UV-curable dielectric material in communication with a first nozzle configured to print the UV-curable dielectric material onto a substrate and a reservoir for a low CTE filler in communication with a second nozzle configured to print the low CTE filler onto the substrate, and a reservoir for a conductive ink in communication with a third nozzle configured to print the conductive ink onto the substrate. The 3D printing system prints the UV-curable dielectric material and the low CTE filler such that the printed low CTE filler mixes with the printed UV-curable dielectric material and forms a UV-curable dielectric layer with the low CTE filler dispersed therein.

In another form of the present disclosure, a 3D printing system includes a reservoir for a UV-curable dielectric material in communication with a mixer and a first nozzle and a reservoir for a surfactant in communication with the mixer and the first nozzle. The mixer is configured to mix the UV-curable dielectric material and the surfactant to form a UV-curable dielectric ink and the first nozzle is configured to print the UV-curable dielectric ink onto a surface. The 3D printing system also includes a reservoir for a low CTE filler in communication with a second nozzle configured to print the low CTE filler onto the substrate such that the printed low CTE filler mixes with the printed UV-curable dielectric material and forms a UV-curable dielectric layer with the low CTE filler dispersed therein. In some variations, the 3D printing system also includes a reservoir for a conductive ink in communication with a third nozzle configured to print the conductive ink and form a conductive layer on the surface.

In still another form of the present disclosure, a method includes 3D printing a first ink containing a UV-curable dielectric material from a first nozzle onto a surface and 3D printing a second ink containing a low CTE filler from a second nozzle different than the first nozzle onto the substrate and forming a UV-curable dielectric layer with a predefined content of the low CTE filler dispersed therein. The method also includes 3D printing a conductive ink from a third nozzle different than the first nozzle and the second nozzle and forming a conductive layer on the substrate. In some variations, the method includes UV curing the UV-curable dielectric layer with the low CTE filler dispersed therein and forming a CTE-tuned dielectric layer on the substrate and thermally curing the conductive layer on the substrate such that a layer of a multi-layer printed circuit board (PCB) is formed.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides a 3D printer and/or a 3D printing system for manufacture of multi-layer PCBs. The 3D printing system includes a 3D printer (e.g., an inkjet 3D printer) that prints and forms a UV-cured dielectric layer with a tuned coefficient of thermal expansion (CTE). As used herein, the phrases "UV-cured dielectric layer with a tuned CTE", "dielectric layer with a tuned CTE", and "CTE-tuned dielectric layer" refer to a 3D printed UV-cured dielectric layer having a predefined CTE that is a function of the composition of a UV-curable dielectric layer containing a UV-curable dielectric material and a low-CTE filler. Stated differently, a composition of a printed UV-curable dielectric layer is adjusted such that, after curing, the UV-cured dielectric layer has a desired CTE. In addition, the CTE is a material property defined as a fractional change in size (dimension, e.g., length) of the material per degree change in temperature at a constant pressure.

In some variations, the 3D printing system additively manufactures a UV-curable dielectric layer using a pre-mixed ink mixture containing the UV-curable dielectric material and the low-CTE filler that is ejected from a 3D printer nozzle or 3D printer head (referred to herein simply as a "nozzle") onto a substrate or previously formed layer. While in other variations, the 3D printing system additively manufactures a UV-curable dielectric layer by printing the UV-curable dielectric material from a first nozzle and printing the low-CTE filler from a second nozzle that is different than the first nozzle. And in such variations, the UV-curable dielectric material and the low-CTE filler are mixed together after being ejected from the first and second nozzles, respectively, onto a substrate or previously formed layer. Stated differently, the UV-curable dielectric material and the low-CTE filler are not pre-mixed before being printed onto a substrate.

Figure 1:
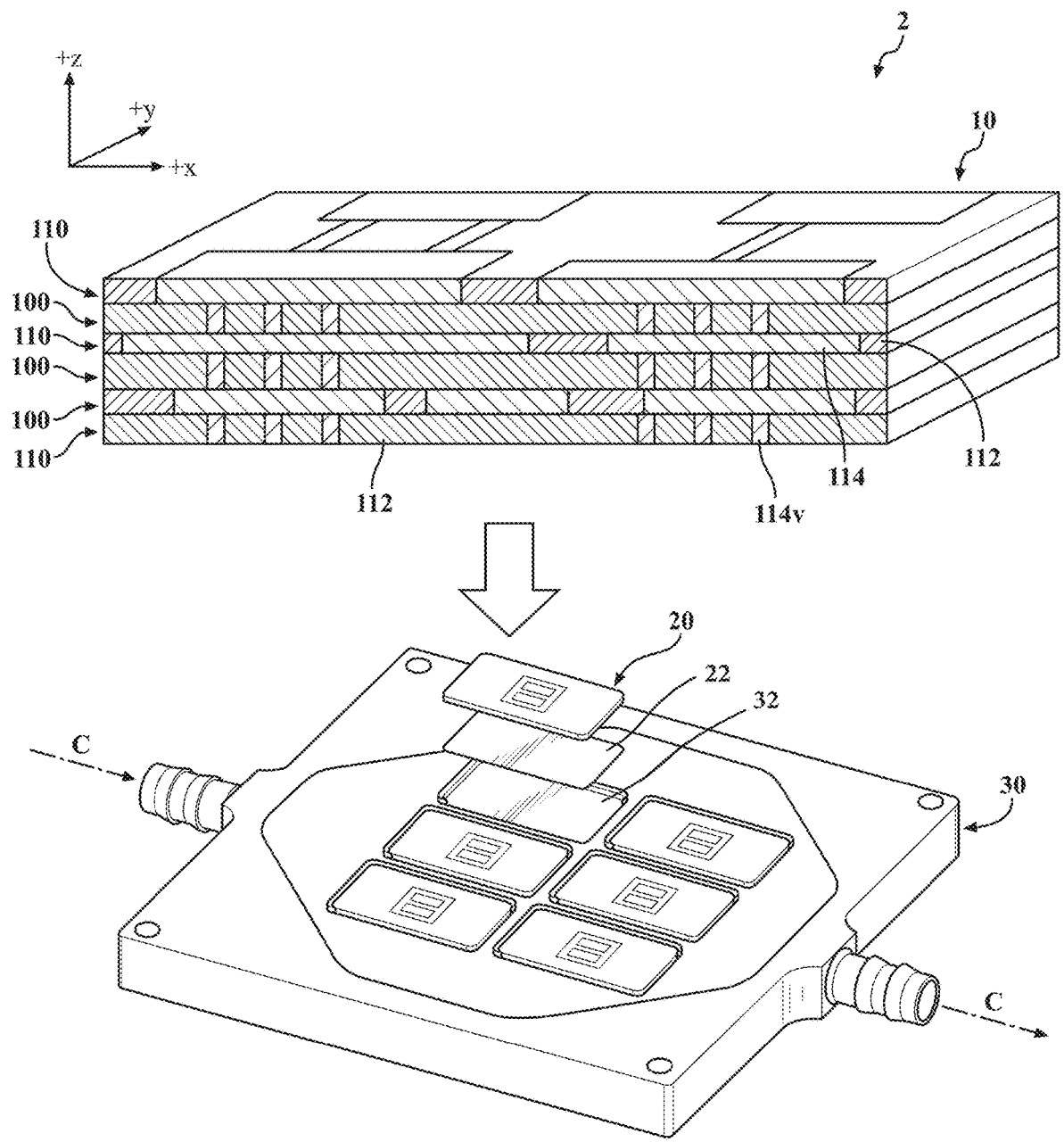
FIG. 1 shows an exploded view of a highly integrated power electronics embedded PCB—cold plate module with a plurality of power devices embedded in a cold plate and an enlarged cross-sectional perspective view of a multi-layer PCB for one of the power devices according to the teachings of the present disclosure.

Referring now to FIG. 1, an exploded view of a highly integrated power electronics embedded PCB—cold plate module 2 with an enlarged view of a 3D printed multi-layer PCB 10 (also referred to herein simply as "multi-layer PCB 10") for one of a plurality of power devices 20 (also referred to herein simply as "power devices 20") embedded in a cold plate 30 is shown. As used herein, the phrase "highly integrated power electronics embedded PCB" refers to a single module or unit with two or more power semiconductor devices, control/drive/protection electronic circuitry, and passive components, embedded in a multi-layer PCB. Also, as used herein, the phrase "power device" refers to a semiconductor device used as a switch or rectifier in power electronics.

The multi-layer PCB 10 includes a plurality of 3D printed dielectric layers 100 and a plurality of 3D printed conductive layers 110 (also referred to herein simply as "dielectric layers 100" and "conductive layers 110", respectively) as described in greater detail below. The conductive layers 110 include a 3D printed dielectric material 112 (also referred to herein simply as a "dielectric material") and a conductive material 114. In the alternative, the conductive layers 110 are formed from a glass reinforced epoxy laminate dielectric material (e.g., FR-4), or other dielectric material, with the conductive material 114 embedded therein. The dielectric layers 100 include the dielectric material 112 and conductive vias 114v that provide electrical communication or pathways between adjacent conductive layers 110. Stated differently, the conductive layers 110 include conductive (e.g., copper) patterns 114 and the dielectric layers 100 include conductive (e.g., copper) pathways that connect the conductive patterns 114 such that the multi-layer PCB 10 functions and/or operates as desired.

It should be understood that the dielectric layers 100 and the conductive layers 110 have a predefined average thickness (z-direction). For example, in some variations, the predefined average thickness is between about 50 micrometers (μm) and about 250 μm, for example, between about 75 μm and about 200 μm. And in at least one variation, the predefined thickness is between about 75 μm and about 150 μm, for example, between about 80 μm and about 120 μm.

In some variations, the cold plate 30 includes a pocket 32 for each power device 20 and the power devices 20 are seated in the pockets 32. And in at least one variation, the power devices 20 are bonded to the cold plate 30 with a bonding layer 22. In addition, in some variations the cold plate 30 includes an inlet 34 and outlet 36 in fluid communication with a cooling or fluid chamber (not shown) such that a coolant 'C' flows through the cold plate 30 and extracts heat generated by the power devices 20 during operation or use of the highly integrated power electronics embedded PCB—cold plate module 2. And as shown in FIG. 1, the highly integrated power electronics embedded PCB—cold plate module 2 formed from the multi-layer PCB 10, plurality of power devices 20, and cold plate 30, illustratively includes six (6) power devices 20.

Figure 2:
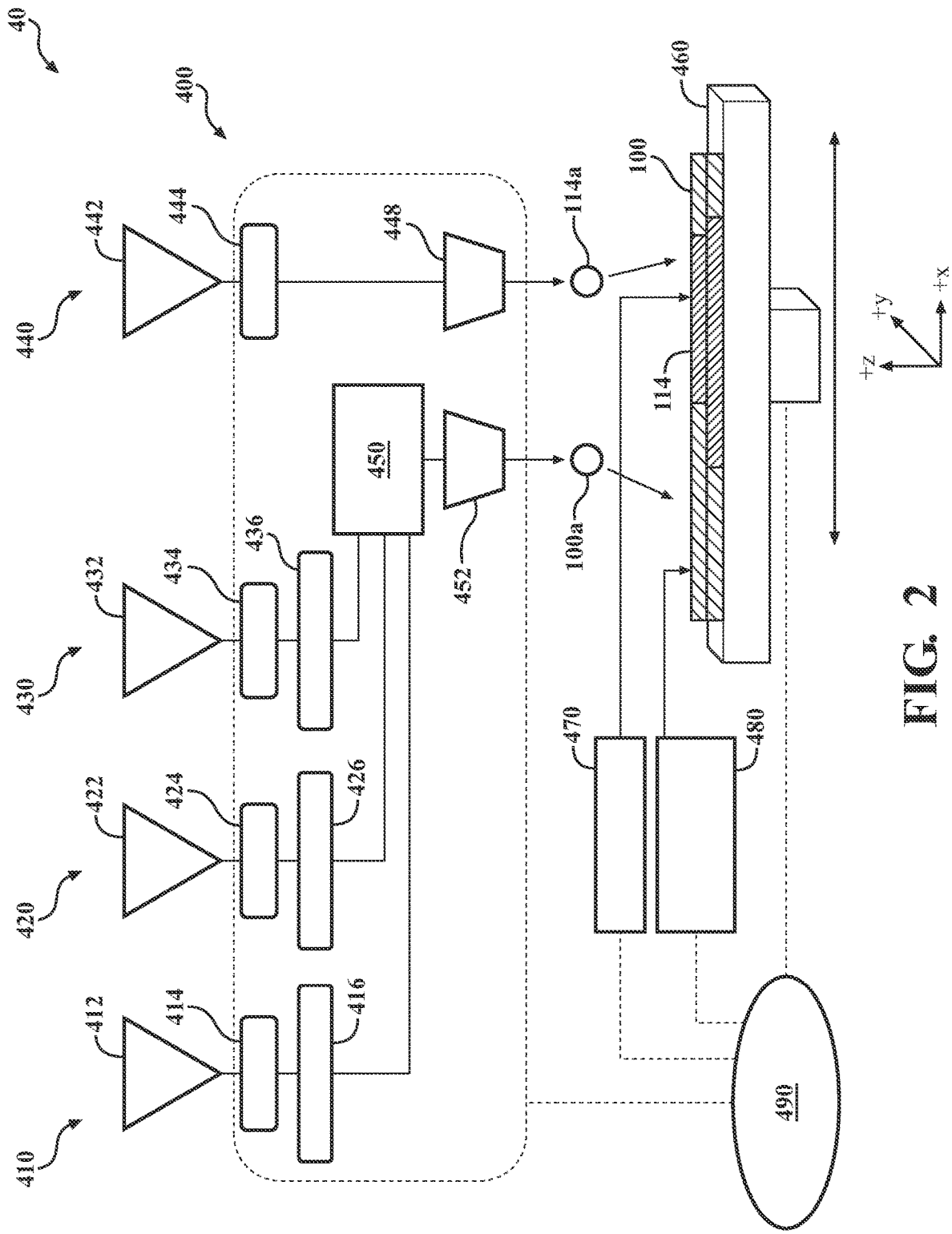
FIG. 2 shows a side view and block diagram of a three dimensional (3D) printing system for manufacturing multi-layer PCBS according to one form of the present disclosure.

Referring now to FIG. 2, a 3D printing system 40 for the manufacture of a multi-layer PCB (e.g., multi-layer PCB 10) according to one form of the present disclosure is shown. The 3D printing system 40 includes a 3D printer 400 (e.g., an inkjet 3D printer), a platform 460, and a controller 490. In some variations, the platform 460 and/or the controller 490 are part of the 3D printer 400, while in other variations, the platform 460 and/or the controller 490 are components that are separate from but in communication with the 3D printer 400 such that the controller 490 can command the 3D printer 400 and the platform 460 to execute predefined operations, movements, etc., as described below.

The 3D printer 400 includes a reservoir 410 (e.g., a bin or a hopper) for a UV-curable dielectric material 412 (with or without additives such as photo-initiators), a reservoir 420 for a low CTE filler 422, a reservoir 440 for a conductive material 442, and a mixer 450 in fluid communication with reservoirs 420, 440. In some variations, the 3D printer 400 also includes a reservoir 430 in fluid communication with the mixer 450, the reservoir 430 being for a surfactant 432 that enhances mixing of the UV-curable dielectric material 412 and the low CTE filler 422 in the mixer 450. And in at least one variation, the reservoir 420 includes a mixture of the low CTE filler 422 and a solvent and/or dispersing agent that enhances flow of the low CTE filler 422 from the reservoir 420 to the mixer 450 and/or enhances mixing of the low CTE filler 422 with the UV-curable dielectric material 412 in the mixer 450.

The UV-curable dielectric material 412 with or without additives such as photo-initiators) can be any UV-curable dielectric material, including without limitation a UV-curable acrylated monomer selected from one or more of an acrylate epoxy, an acrylate polyester, an acrylate urethane, and an acrylate silicone, among others. Also, the low CTE filler 422 can be any filler having a CTE less than the CTE of the UV-curable dielectric material 412 after being cured, including without limitation a ceramic filler and/or a cellulose nanofiber filler, among others. For example, the ceramic filler can include nanoparticles selected from one or more of aluminum nitride, silicon nitride, cordierite, and aluminum oxide, among others. In some variations, a surfactant and/or a dispersing agent can be included in the low CTE filler 422 such that enhanced dispersion with reduced "clumping" or segregation of a ceramic filler and/or cellulose nanofiber filler within the solvent mentioned above is provided.

In at least one variation, the 3D printer 400 includes: a pump 414 and/or a flow controller 416 for controlling flow of the UV-curable dielectric material 412 from the reservoir 410 to the mixer 450; a pump 424 and/or a flow controller 426 for controlling flow of the low CTE filler 422 from the reservoir 420 to the mixer 450; and/or a pump 434 and/or a flow controller 436 for controlling flow of the surfactant 432 from the reservoir 430 to the mixer 450.

The mixer 450 is configured to desirably mix the UV-curable dielectric material 412, the low CTE filler 422, and the surfactant 432 (when included) into a UV-curable dielectric ink 100a that includes the UV-curable dielectric material 412 and flows from a first nozzle 452 to form a dielectric layer 100. In addition, the 3D printer 400 can include a pump 444 and/or a flow controller (not shown) for controlling flow of a conductive ink 114a containing the conductive material 442 from the reservoir 440 to a second nozzle 448 to form a conductive layer 114. In some variations, the conductive ink 114a includes silver nanoparticles and/or graphene nanosheets. And as noted above, the term "nozzle" as used herein refers to a nozzle for direct writing of material onto a surface (also known as direct-ink-writing (DIW)) or a printer head having an array of nozzles in which ink droplets are deposited on a surface (also known as 3D inkjet printing). Accordingly, in some variations the 3D printer 400, and other 3D printers disclosed herein, is a DIW 3D printer, while in other variations, the 3D printer 400, and other 3D printers disclosed herein, is a 3D inkjet printer.

It should be understood that the platform 460 and/or the nozzles 452, 448 can have three degrees of freedom, i.e., can move in the x, y, and z-directions shown in the figure. For example, in some variations the platform 460 moves in the x and y directions while the nozzles 452, 448 print a given layer of a multi-layer PCB on a surface of the platform 460 (also referred to hereafter simply as "on the platform" or "onto the platform"), and then after 3D printing of the given layer is complete, the platform 460 moves in the −z direction by a predefined distance (e.g., a distance equal to a thickness of the just formed layer) such that the nozzles 452, 448 can print another layer of the multi-layer PCB.

Still referring to FIG. 2, in some variations the 3D printing system 40 includes a thermal curing device 470 (e.g., a heater) configured to thermally cure the conductive ink 114a printed on the platform 460 or a previously formed layer and/or a UV curing device 480 (e.g., a UV light source) configured to UV cure the UV-curable dielectric ink 100a printed on the platform 460 or a previously formed layer. In at least one variation, the UV curing device 480 includes a thermal curing function such that the UV-curable dielectric ink 100a is UV and thermally cured before and/or during 3D printing of a subsequent layer of the multi-layer PCB.

As noted above, the 3D printing system 40 includes a controller 490. In some variations, the controller 490 is configured to command the pump 414, the flow controller 416, the pump 424, the flow controller 426, the pump 434, and/or the flow controller 436, such that a desired amount of UV-curable dielectric material 412, low CTE filler 422, and surfactant 432 (when included) is provided to the mixer 450. And in such variations, the mixer 450 is configured to mix the UV-curable dielectric material 412, low CTE filler 422, and surfactant 432 (when included) such that a desired UV-curable dielectric ink 100a flows and exits from the first nozzle 452 at a desired flow rate. It should be understood that the UV-curable dielectric ink 100a is deposited (printed) on the platform 460 or other surface (e.g., a previously formed layer) at predefined voxels of a given layer of the multi-layer PCB. In addition, the controller 490 can be configured to command the mixer 450 and/or the first nozzle 452 such that the desired UV-curable dielectric ink 100a flows and exits from the first nozzle 452 at a desired flow rate. Similarly, in some variations the controller 490 is configured to command the pump 444, a corresponding flow controller (not shown), and/or the second nozzle 448 such that a desired amount of conductive ink 114a flows and exits the second nozzle 448 at desired flow rate, and is deposited (printed) on the platform 460 or a previously formed layer at predefined voxels.

During operation of the 3D printing system 40, the controller 490 is provided information (e.g., from a user interface, look-up table, etc.) for the manufacture of a multi-layer PCB (referred to hereafter as the multi-layer PCB 10). The multi-layer PCB 10 has a plurality of layers, and each layer can include a predefined electronic circuitry with predefined regions, areas, layers, and/or traces of conductive material combined with, or absence of, predefined regions, areas, layers, and/or traces of dielectric material. Stated differently, a given layer of the multi-layer PCB 10 has a predefined design or layout of conductive material and dielectric material. In addition, the controller 490 commands the various components described above such that each dielectric layer 100 and each conductive layer 110 of the multi-layer PCB 10 is 3D printed and cured until the entire multi-layer PCB 10 is formed. In this manner, multi-layer PCBs 10 are manufactured before being bonded to the cold plate 30 with the plurality of power devices 20 bonded thereto such that the highly integrated power devices embedded multi-layer PCB—cold plate module 2 is provided. In the alternative, a multi-layer PCB 10 is manufactured (printed) on a cold plate 30 with a plurality of power devices 20 bonded thereto such that the highly integrated power devices embedded multi-layer PCB—cold plate module 2 is provided.

Figure 3:
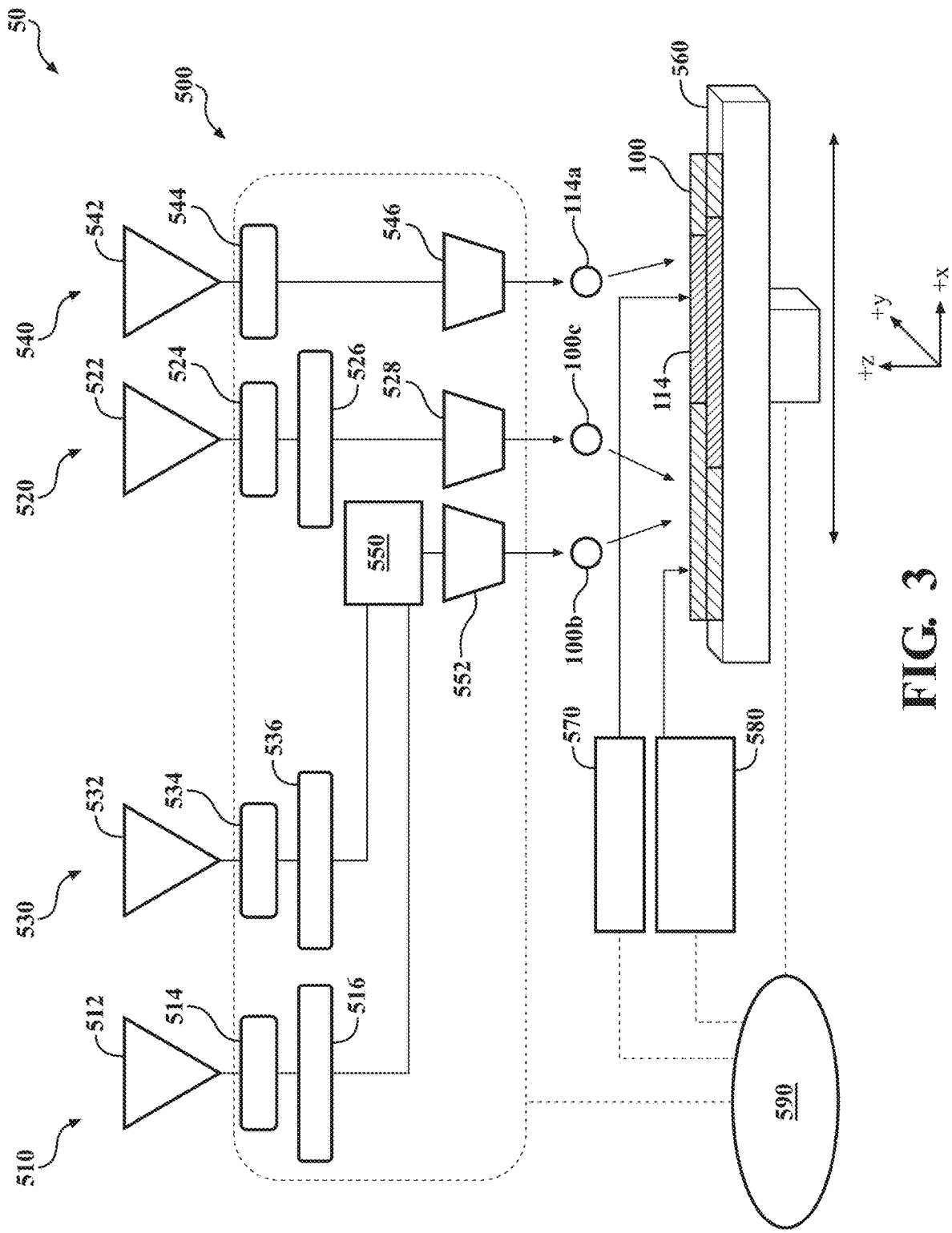
FIG. 3 shows a side view and block diagram of another 3D printing system for manufacturing multi-layer PCBS according to one form of the present disclosure.

Referring to FIG. 3, a 3D printing system 50 for the manufacture of multi-layer PCBs according to another form of the present disclosure is shown. The 3D printing system 50 includes a 3D printer 500 (e.g., an inkjet 3D printer), a platform 560, and a controller 590. In some variations, the platform 560 and/or the controller 590 are part of the 3D printer 500, while in other variations, the platform 560 and/or the controller 590 are components that are separate from but in communication with the 3D printer 500 such that the controller 590 can command the 3D printer 500 and the platform 560 to execute predefined operations, movements, etc., as described below.

The 3D printer 500 includes a reservoir 510 (e.g., a bin or a hopper) for a UV-curable dielectric material 512, a reservoir 520 for a low CTE filler 522, and a reservoir 540 for a conductive material 542. In some variations, the 3D printer 500 also includes a reservoir 530 for a surfactant 532 that enhances mixing of the UV-curable dielectric material 512 and the low CTE filler 522. However, and in contrast to the 3D printer 400, the reservoir 510, and the reservoir 530 when included, is/are in fluid communication with a first nozzle 552, and the reservoir 520 is in fluid communication with a second nozzle 528. That is, a first ink 100b containing the UV-curable dielectric material 512 exits and flows from the first nozzle 552 and a second ink 100c containing the low CTE filler 522 exits and flows from the second nozzle 528 such that the UV-curable dielectric material 512 and the low CTE filler 522 mix together after being separately printed onto the platform 560 or a previously printed layer. And in some variations, the reservoir 520 includes a mixture of the low CTE filler 522 and a solvent and/or a dispersing agent that enhances flow of the low CTE filler 522 from the reservoir 520 to the second nozzle 528 and/or enhances mixing/dispersion of the second ink 100c with/in the first ink 100b, i.e., enhances mixing of the low CTE filler 522 with the UV-curable dielectric material 512.

In at least one variation, the 3D printer 500 includes: a pump 514 and/or a flow controller 516 for controlling flow of the UV-curable dielectric material 512 from the reservoir 510 to a mixer 550; a pump 534 and/or a flow controller 536 for controlling flow of the surfactant 532 from the reservoir 530 to the mixer 550; and/or a pump 524 and/or a flow controller 526 for controlling flow of the low CTE filler 522 from the reservoir 520 to the second nozzle 528.

The mixer 550 is configured to desirably mix the UV-curable dielectric material 512 and the surfactant 532 (when included). In addition, the 3D printer 500 can include a pump 544 and/or a flow controller (not shown) for controlling flow of a conductive ink 114a containing the conductive material 542 from the reservoir 540 to a third nozzle 548 to form a conductive layer 114.

It should be understood that the platform 560 and/or the nozzles 552, 528, 546 can have three degrees of freedom, i.e., can move in the x, y, and z-directions shown in the figure. For example, in some variations the platform 560 moves in the x and y directions while the nozzles 552, 528, 546 print a given layer of a multi-layer PCB, and then after 3D printing of the given layer is complete, the platform 560 moves in the −z direction by a predefined amount such that the nozzles 552, 528, 546 print another layer of the multi-layer PCB.

Still referring to FIG. 3, in some variations the 3D printing system 50 includes a thermal curing device 570 (e.g., a heater) configured to thermally cure the conductive ink 114a printed onto the platform 560 or a previously formed layer. And in at least one variation the 3D printing system 50 a UV curing device 580 (e.g., a UV light source) configured to UV cure the first ink 100b, with the low CTE filler ink 100c mixed or dispersed therein, printed onto the platform 560 or a previously formed layer. In at least one variation, the UV curing device 580 includes a thermal curing function such that a UV-curable dielectric layer 112 is UV and thermally cured before and/or during 3D printing of a subsequent layer of the multi-layer PCB.

As noted above, the 3D printer 500 includes a controller 590. In some variations, the controller 590 is configured to command the pump 514, the flow controller 516, the pump 534, the flow controller 536, the pump 524, and/or the flow controller 526, such that a desired amount of UV-curable dielectric material 512 and/or surfactant 532 is provided to the mixer 550. And in such variations, the mixer 550 is configured to mix the UV-curable dielectric material 512 and surfactant 532 such that a desired first ink 100b flows and exits from the first nozzle 552 at a desired flow rate. It should be understood that the UV-curable dielectric ink 100a is deposited (printed) onto the platform 560 or a previously formed layer at predefined voxels of a given layer of the multi-layer PCB.

Similarly, the controller 590 is configured to command the pump 524 and/or the flow controller 526 such that a desired amount of low CTE filler 522 is provided to the second nozzle 528 and a desired low CTE filler ink 100c flows and exits from the second nozzle 528 at a desired flow rate. The low CTE filler ink 100c can be printed before, after, or during printing of the first ink 100b such that the second ink 100c is deposited and mixes with the first ink 100b deposited on the platform 560 or a previously formed layer. And in some variations, the controller 590 is configured to command the pump 544, a corresponding flow controller (not shown), and/or the third nozzle 546 such that a desired amount of conductive ink 114a flows and exits the third nozzle 546 at desired flow rate and is deposited (printed) onto the platform 560 or a previously formed layer.

In some variations, the second ink 100c desirably mixes with the first ink 100b without use of external mixing actuator. In other variations, mixing of the second ink 100c with the first ink 100b is enhanced with an external mixing actuator 585. Non-limiting examples of the external mixing actuator 585 include an ultrasonic mixing actuator that transmits ultrasonic waves into the first ink 100b and the second ink 100c deposited onto the platform 560 or a previously formed layer, an electromagnetic mixing actuator that transmits electromagnetic waves into the first ink 100b and the second ink 100c deposited onto the platform 560 or a previously formed layer, among others.

During operation, the controller 590 is provided information (e.g., from a user interface, look-up table, etc.) for the manufacture of a multi-layer PCB (referred to hereafter as the multi-layer PCB 10). In addition, the controller 590 commands the various components described above such that each layer of the multi-layer PCB 10 is 3D printed and cured until the entire multi-layer PCB 10 is formed. In this manner, the multi-layer PCB 10 is manufactured before being bonded to the cold plate 30 with the plurality of power devices 20 bonded thereto such that the highly integrated power devices embedded multi-layer PCB—cold plate module 2 is formed. In the alternative, the multi-layer PCB 10 is manufactured (printed) on the cold plate 30 with the plurality of power devices 20 bonded thereto such that the highly integrated power devices embedded multi-layer PCB—cold plate module 2 is provided.

Figure 4:
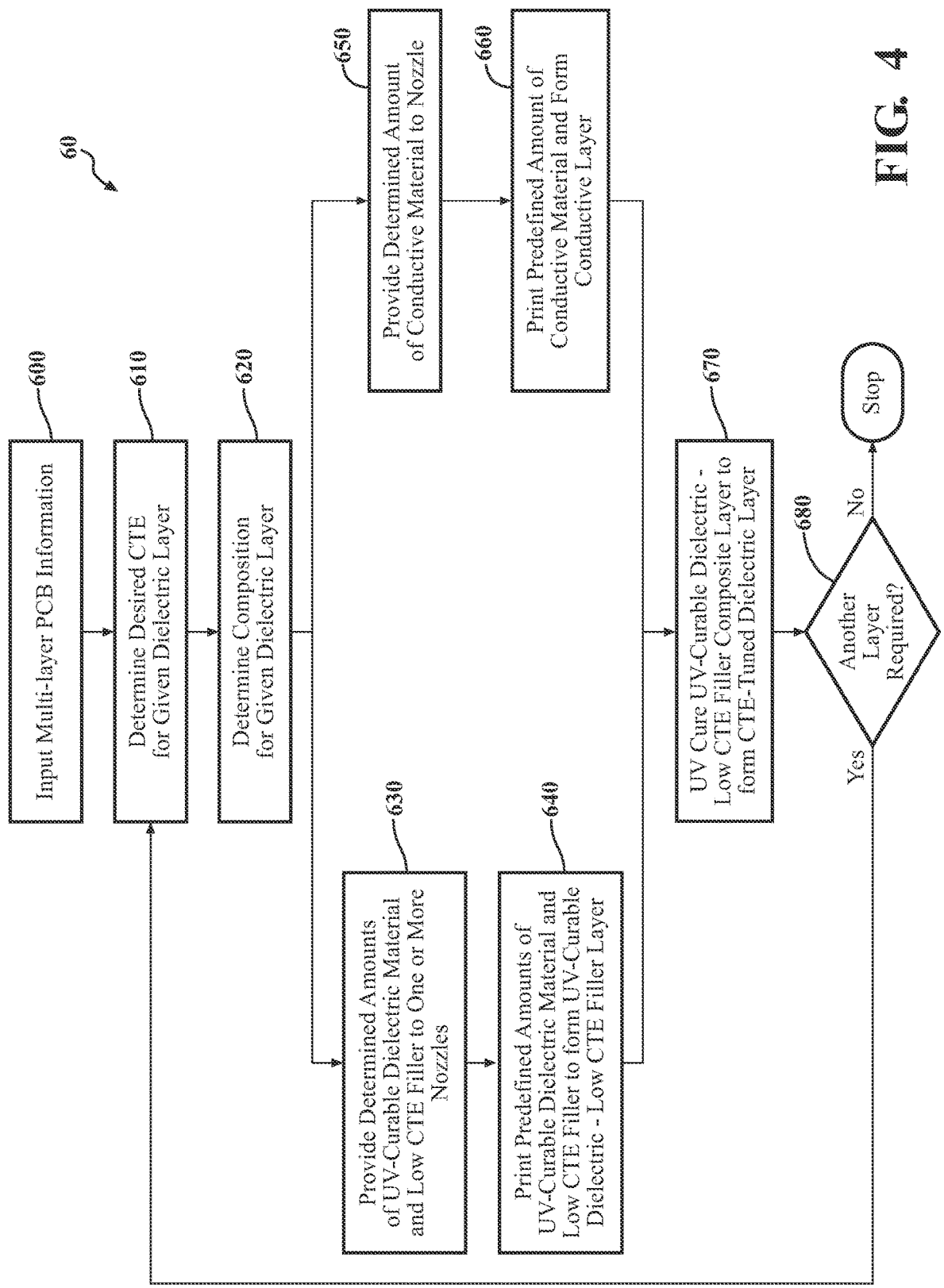
FIG. 4 is a flow chart for a method of manufacturing a multi-layer PCB according to the teachings of the present disclosure.

Referring to FIG. 4, a flow chart for a method 60 of manufacturing a multi-layer PCB using the 3D printing systems 40, 50 according to the teachings of the present disclosure is shown. The method 60 includes inputting information, e.g., design information, of a desired multi-layer PCB into the controller 490, 590 at 600 and determining a desired CTE for a given dielectric layer at 610. The information of the desired multi-layer PCB can include the number of layers of the multi-layer PCB, the circuitry design or layout of each of the layers of the multi-layer PCB, predefined voxels for each layer of the multi-layer PCB, materials to be 3D printed for each predefined voxel, intensity of a UV light for UV curing a given UV-curable dielectric ink, a time period for UV curing a given UV-curable dielectric ink, a temperature or range of temperatures for thermally curing a given UV-curable dielectric ink, a time period for thermally curing a given UV-curable dielectric ink, a temperature or range of temperatures for thermally curing a given conductive ink, and a time period for thermally curing a given conductive ink, among others.

Determining a desired CTE for a given dielectric layer can include calculating or selecting from a look-up table the desired CTE as function of a predefined stress level between a UV-cured dielectric layer and a cold plate, UV-cured dielectric layer and a previously formed UV-cured dielectric layer and/or conductive layer, and/or UV-cured dielectric layer and a UV-cured dielectric layer and/or conductive layer to be subsequently formed. Stated differently, the desired CTE for a given UV-cured dielectric layer can include calculating the desired CTE as function of a predefined stress level between the given UV-cured dielectric layer and an adjacent surface/layer not to be exceeded during the manufacture and/or use of a given multi-layer PCB.

The method 60 includes determining a composition of the UV-cured dielectric layer at 620 that will have the desired CTE determined at 610 or will have the desired CTE determined at 610 within a predefined range/error (e.g., within +/−5% or +/−10% of the desired CTE determined at 610). Determining the composition of the UV-cured dielectric layer at 620 can include calculating or selecting from a look-up table a weight percentage of a type or selection of a particular UV-curable dielectric material, a weight percentage of a type or selection of a particular low CTE filler, a weight percentage of a type of selection of a particular surfactant, among others.

The method 60 proceeds to 630 where amounts (e.g., grams, milligrams, milli-liters, etc.) of the UV-curable dielectric material and the low CTE filler from 620 are determined and provided to a mixer and/or one or more nozzles. A UV-curable dielectric ink with the low CTE filler, or a UV-curable dielectric ink and a low CTE filler ink, are printed (at predefined voxels) onto a cold plate or previously formed layer at 640 to form a UV-curable Dielectric—low CTE filler layer for a given layer of the multi-layer PCB. In addition, the method 60 determines and provides an amount of the conductive material to a nozzle at 650, and prints a conductive ink (at predefined voxels) onto the cold plate or previously formed layer at 660 to from a conductive layer for the given layer of the multi-layer PCB. In should be understood that printing of the conductive layer can include printing of the conductive material during, before, and/or after the UV-curable dielectric ink and the low CTE filler ink are printed. Stated differently, the method 60 includes, for a given layer of a multi-layer PCB, printing an entire UV-curable dielectric material—low CTE filler layer before printing the conductive layer, printing an entire conductive layer before printing the UV-curable dielectric material—low CTE filler layer, printing only portions of a UV-curable dielectric material—low CTE filler layer before printing portions of, or an entirety of, a conductive layer (and vice-versa), or printing the UV-curable dielectric material—low CTE filler layer simultaneously with printing the conductive layer.

The method also includes UV curing, and optionally thermal curing, the UV-curable Dielectric—low CTE filler layer at 670 such that a CTE-tuned dielectric layer is formed. In addition, the conductive layer can be thermally cured at 670 (not shown).

The method proceeds to 680 where determination of whether or not another layer is required per the multi-layer PCB information input at 600. If another layer is required, the method 60 returns to 610 where a desired CTE for the next UV-cured dielectric layer is determined and the method proceeds through 620-630-640-650-660-670 again until all layers of the multi-layer PCB have been formed.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The figures illustrate the architecture, functionality, and operation of possible implementations of systems, methods, and computer program products according to various embodiments. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may in fact, be executed substantially concurrently, or the blocks may sometimes be executed in the reverse order, depending upon the functionality involved.

The systems, components, devices, processes, and/or controllers described above can be realized in hardware or a combination of hardware and software and can be realized in a centralized fashion in one processing system or in a distributed fashion where different elements are spread across several interconnected processing systems. Any kind of processing system or another apparatus adapted for conducting the methods described herein is suited. A typical combination of hardware and software can be a processing system with computer-usable program code that, when being loaded and executed, controls the processing system such that it conducts the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, which when loaded in a processing system, is able to conduct these methods.

Furthermore, arrangements described herein may take the form of a computer program product embodied in one or more computer-readable media having computer-readable program code embodied, e.g., stored, thereon. Any combination of one or more computer-readable media may be utilized. The computer-readable medium may be a computer-readable signal medium or a computer-readable storage medium. The phrase "computer-readable storage medium" means a non-transitory storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk drive (HDD), a solid-state drive (SSD), a read-only memory (ROM), an erasable programmable read-only memory (EPROM or Flash memory), a portable compact disc read-only memory (CD-ROM), a digital versatile disc (DVD), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms incorporating different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A method comprising:
   3D printing a first ink comprising UV-curable dielectric material mixed with a low CTE filler from a first nozzle onto a substrate and forming a UV-curable dielectric layer with a predefined content of the low CTE filler dispersed therein;
   3D printing a second ink comprising a conductive material from a second nozzle different than the first nozzle and forming a conductive layer on the substrate;
   UV curing the UV-curable dielectric layer with the low CTE filler dispersed therein and forming a CTE-tuned dielectric layer on the substrate; and
   thermally curing the conductive layer on the substrate such that a layer of a multi-layer printed circuit board (PCB) is formed.

2. The method according to claim 1 further comprising printing a plurality of UV-curable dielectric layers with predefined contents of the low CTE filler dispersed therein, UV curing the plurality of UV-curable dielectric layers and forming a plurality of CTE-tuned dielectric layers on the substrate, printing a plurality of conductive layers, and thermally curing the plurality of conductive layers and forming a multi-layer PCB.

3. The method according to claim 1 further comprising determining a desired CTE for the CTE-tuned dielectric layer, wherein the predefined content of the low CTE filler dispersed in the UV-curable dielectric layer is a function of the desired CTE.

4. The method according to claim 1 further comprising mixing a surfactant with the UV-curable dielectric material and the low CTE filler.

5. The method according to claim 1, wherein the low CTE filler is a ceramic.

6. The method according to claim 5, wherein the ceramic is selected from the group consisting of aluminum nitride, silicon nitride, cordierite, aluminum oxide, and combinations thereof.

7. The method according to claim 1, wherein the low CTE filler is cellulose nanofiber filler.

8. The method according to claim 1, wherein the UV-curable dielectric material is a UV-curable acrylated monomer.

9. The method according to claim 8, wherein the UV-curable acrylated monomer is selected from the group consisting of an acrylate epoxy, an acrylate polyester, an acrylate urethane, an acrylate silicone, and combinations thereof.

10. The method according to claim 1, wherein the conductive material comprises at least one of silver nanoparticles and graphene nanosheets.

11. The method according to claim 1 further comprising thermal curing the UV-curable dielectric layer with the low CTE filler dispersed therein.

12. A method comprising:
    mixing a UV-curable dielectric material with a predefined content of a low CTE filler and forming a first ink;
    3D printing the first ink onto a substrate and forming a UV-curable dielectric layer with the low CTE filler dispersed therein;
    UV curing the UV-curable dielectric layer with the low CTE filler dispersed therein and forming a CTE-tuned dielectric layer on the substrate;
    3D printing a second ink comprising a conductive material and forming a conductive layer on the substrate; and
    thermally curing the conductive layer on the substrate such that a layer of a multi-layer printed circuit board (PCB) is formed.

13. The method according to claim 12, further comprising 3D printing the first ink and forming a plurality of UV-curable dielectric layers with predefined contents of the low CTE filler dispersed therein, UV curing the plurality of UV-curable dielectric layers and forming a plurality of CTE-tuned dielectric layers on the substrate, 3D printing the second ink and forming a plurality of conductive layers, and thermally curing the plurality of conductive layers and forming a multi-layer PCB.

14. The method according to claim 12 further comprising determining a desired CTE for the CTE-tuned dielectric layer, wherein the predefined content of the low CTE filler dispersed in the UV-curable dielectric layer is a function of the desired CTE.

15. The method according to claim 12 further comprising mixing a surfactant with the UV-curable dielectric material and the predefined content of the low CTE filler.

16. The method according to claim 12, wherein the low CTE filler is a ceramic selected from the group consisting of aluminum nitride, silicon nitride, cordierite, aluminum oxide, and combinations thereof.

17. The method according to claim 12, wherein the low CTE filler is cellulose nanofiber filler.

18. The method according to claim 12, wherein the UV-curable dielectric material is a UV-curable acrylated monomer selected from the group consisting of an acrylate epoxy, an acrylate polyester, an acrylate urethane, an acrylate silicone, and combinations thereof.

19. The method according to claim 12, wherein the conductive material comprises at least one of silver nanoparticles and graphene nanosheets.

20. The method according to claim 12 further comprising thermal curing the UV-curable dielectric layer with the low CTE filler dispersed therein.

* * * * *